United States Patent
Kesler et al.

(10) Patent No.: US 8,928,337 B2
(45) Date of Patent: Jan. 6, 2015

(54) DEVICE FOR MEASURING ELECTRICAL CURRENT AND METHOD OF MANUFACTURING THE SAME

(75) Inventors: James R. Kesler, Pullman, WA (US); Veselin Skendzic, East Norriton, PA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 284 days.

(21) Appl. No.: 13/479,139

(22) Filed: May 23, 2012

(65) Prior Publication Data

US 2013/0193987 A1   Aug. 1, 2013

Related U.S. Application Data

(60) Provisional application No. 61/591,402, filed on Jan. 27, 2012.

(51) Int. Cl.
*G01R 27/28* (2006.01)

(52) U.S. Cl.
USPC ............. 324/654; 336/83; 336/185; 336/192; 336/234; 324/117 R; 324/150; 16/224

(58) Field of Classification Search
CPC .......... G01R 3/00; G01R 15/181; H01F 5/02; H01F 38/30
USPC ........................... 324/654; 336/184, 173, 160
See application file for complete search history.

(56) References Cited

U.S. PATENT DOCUMENTS

| | | |
|---|---|---|
| 1,942,575 A | 1/1934 | Shapiro |
| 2,599,550 A | 6/1952 | Fraser |
| 2,845,562 A | 7/1958 | Bendell |
| 3,203,077 A | 8/1965 | Zimmerle |
| 3,684,955 A | 8/1972 | Adams |
| 3,942,029 A | 3/1976 | Kawakami |

(Continued)

FOREIGN PATENT DOCUMENTS

| | | |
|---|---|---|
| EP | 573350 | 12/1993 |
| EP | 652441 | 5/1995 |

(Continued)

OTHER PUBLICATIONS

Pulse Electronics, Sidewinder Current Sensor, Jul. 28, 2011.

(Continued)

*Primary Examiner* — Benjamin M Baldridge
(74) *Attorney, Agent, or Firm* — Jared L. Cherry; Richard M. Edge

(57) ABSTRACT

Disclosed herein are embodiments of devices for measuring electrical current and related systems and methods for forming and using such devices. According to certain embodiments, devices according to the present disclosure may comprise Rogowski coils. Also disclosed are systems and methods for forming a current measuring device using a bobbin that may allow for the use of a continuous length of wire for all windings associated with the current measuring device. Automated manufacturing techniques may be utilized to facilitate the manufacture of devices for measuring electrical current and/or may reduce the cost of such devices. Various embodiments disclosed herein include the use of a bobbin that may be selectively configured between a linear configuration and a closed configuration. One or more current sensors disclosed herein may be utilized in connection with a motor management relay or other type of intelligent electronic device.

32 Claims, 12 Drawing Sheets

(56) References Cited

U.S. PATENT DOCUMENTS

| | | | | |
|---|---|---|---|---|
| 4,616,176 | A | 10/1986 | Mercure | |
| 4,700,131 | A | 10/1987 | Miller | |
| 4,709,205 | A * | 11/1987 | Baurand et al. | 324/127 |
| 4,799,005 | A | 1/1989 | Fernandes | |
| 4,803,425 | A | 2/1989 | Swanberg | |
| 4,808,959 | A | 2/1989 | Weissman | |
| 4,810,954 | A | 3/1989 | Fam | |
| 4,831,327 | A | 5/1989 | Chenier | |
| 4,899,246 | A * | 2/1990 | Tripodi | 361/44 |
| 5,012,218 | A | 4/1991 | Haug | |
| 5,055,816 | A | 10/1991 | Altman | |
| 5,066,904 | A | 11/1991 | Bullock | |
| 5,223,790 | A | 6/1993 | Baran | |
| 5,233,324 | A * | 8/1993 | Beihoff et al. | 336/83 |
| 5,272,460 | A | 12/1993 | Baumgartner | |
| 5,414,400 | A | 5/1995 | Gris | |
| 5,442,280 | A | 8/1995 | Baudart | |
| 5,461,299 | A | 10/1995 | Bruni | |
| 5,461,309 | A | 10/1995 | Baudart | |
| 5,627,475 | A | 5/1997 | Strosser | |
| 5,808,846 | A * | 9/1998 | Holce et al. | 361/93.6 |
| 5,831,506 | A | 11/1998 | Crepel | |
| 5,852,395 | A | 12/1998 | Bosco | |
| 5,917,316 | A | 6/1999 | Bosco | |
| 5,982,265 | A | 11/1999 | Von Skarczinski | |
| 6,008,711 | A | 12/1999 | Bolam | |
| 6,094,044 | A | 7/2000 | Kustera | |
| 6,137,394 | A | 10/2000 | Holmes | |
| 6,184,672 | B1 | 2/2001 | Berkcan | |
| 6,203,077 | B1 * | 3/2001 | Schlack | 292/203 |
| 6,215,296 | B1 | 4/2001 | Arnoux | |
| 6,255,565 | B1 | 7/2001 | Tamura | |
| 6,288,625 | B1 | 9/2001 | Kaczkowski | |
| 6,300,857 | B1 | 10/2001 | Herwig | |
| 6,313,623 | B1 | 11/2001 | Kojovic | |
| 6,351,114 | B1 | 2/2002 | Iwasaki | |
| 6,366,076 | B1 | 4/2002 | Karrer | |
| 6,369,687 | B1 * | 4/2002 | Akita et al. | 336/234 |
| 6,380,727 | B1 | 4/2002 | Jitaru | |
| 6,420,952 | B1 | 7/2002 | Redilla | |
| 6,437,555 | B1 | 8/2002 | Pioch | |
| 6,566,854 | B1 | 5/2003 | Hagmann | |
| 6,614,218 | B1 | 9/2003 | Ray | |
| 6,624,624 | B1 | 9/2003 | Karrer | |
| 6,680,608 | B2 | 1/2004 | Kojovic | |
| 6,731,193 | B2 | 5/2004 | Meier | |
| 6,822,547 | B2 | 11/2004 | Saito | |
| 6,825,650 | B1 | 11/2004 | McCormack | |
| 6,940,702 | B2 | 9/2005 | Kojovic | |
| 6,958,673 | B2 | 10/2005 | Suzuki | |
| 6,965,225 | B2 * | 11/2005 | de Buda | 324/117 R |
| 7,009,486 | B1 | 3/2006 | Goeke | |
| 7,078,888 | B2 | 7/2006 | Budillon | |
| 7,106,162 | B2 | 9/2006 | Saito | |
| 7,109,838 | B2 | 9/2006 | Brennan | |
| 7,227,441 | B2 | 6/2007 | Skendzic | |
| 7,227,442 | B2 | 6/2007 | Skendzic | |
| 7,474,192 | B2 | 1/2009 | Skendzic | |
| 7,545,138 | B2 | 6/2009 | Wilkerson | |
| 7,733,208 | B2 * | 6/2010 | Wolfgram | 336/208 |
| 7,825,763 | B2 | 11/2010 | Dupraz | |
| 7,902,812 | B2 * | 3/2011 | Kojovic | 324/117 R |
| 2003/0090356 | A1 | 5/2003 | Saito | |
| 2004/0008461 | A1 | 1/2004 | Kojovoc | |
| 2004/0012901 | A1 | 1/2004 | Kojovoc | |
| 2004/0178875 | A1 | 9/2004 | Saito | |
| 2005/0052268 | A1 | 3/2005 | Pleskach | |
| 2005/0156587 | A1 | 7/2005 | Yakymyshyn | |
| 2005/0156703 | A1 | 7/2005 | Twaalfhoven | |
| 2005/0248430 | A1 | 11/2005 | Dupraz | |
| 2006/0066425 | A1 * | 3/2006 | Gruner | 335/128 |
| 2006/0174834 | A1 | 8/2006 | Long | |
| 2006/0176140 | A1 | 8/2006 | Skendzic | |
| 2006/0232263 | A1 | 10/2006 | Kovanko | |
| 2006/0232265 | A1 | 10/2006 | Fritsch | |
| 2007/0199176 | A1 * | 8/2007 | McClellan | 16/224 |
| 2008/0252409 | A1 * | 10/2008 | Kojima | 336/185 |
| 2011/0025304 | A1 * | 2/2011 | Lint et al. | 324/150 |
| 2011/0025305 | A1 * | 2/2011 | Lint et al. | 324/150 |
| 2011/0148561 | A1 * | 6/2011 | Lint et al. | 336/192 |

FOREIGN PATENT DOCUMENTS

| | | |
|---|---|---|
| EP | 808460 | 11/1997 |
| EP | 587491 | 4/1998 |
| EP | 889490 | 1/1999 |
| EP | 1596205 | 11/2005 |
| GB | 2034487 | 6/1980 |
| GB | 2259150 | 3/1993 |
| JP | 2001102230 | 4/2001 |
| JP | 2003173922 | 6/2003 |
| JP | 2004228296 | 8/2004 |
| WO | 0072027 | 11/2000 |

OTHER PUBLICATIONS

PCT/US2012/041002 Patent Cooperation Treaty, International Search Report and Written Opinion of the International Searching Authority, Aug. 31, 2012.

W.Z. Fam, A Combined Current and Voltage Sensor for Metering and Protection in High Voltage Power Systems, Canadian Conference on Electrical Computer Engineering. p. 145-151, Sep. 1994.

Ramboz, J.D., "Machinable Rogowski Coil, Design, and Calibration," IEEE Transactions on Instrumentation and Measurement, vol. 45, No. 2, pp. 511-515, Apr. 1996.

Patent Cooperation Treaty, International Search Report PCT/US2005/0043164, Sep. 25, 2006.

Patent Cooperation Treaty, International Preliminary Report on Patentability PCT/US2005/043164, Sep. 25, 2006.

Patent Cooperation Treaty, International Preliminary Report on Patentability PCT/US2007/015557, Jul. 17, 2008.

Patent Cooperation Treaty, International Search Report PCT/US2007/015557, Jul. 17, 2008.

* cited by examiner

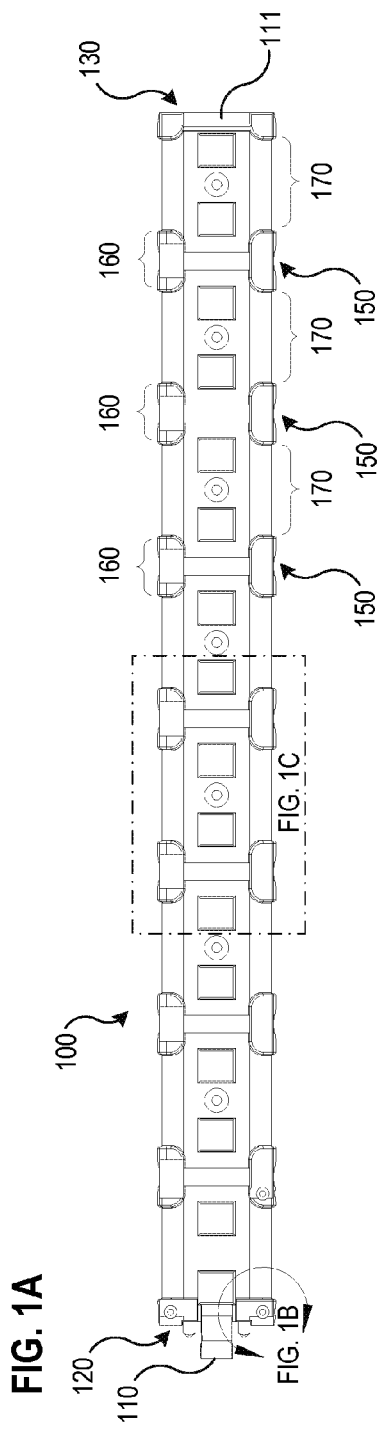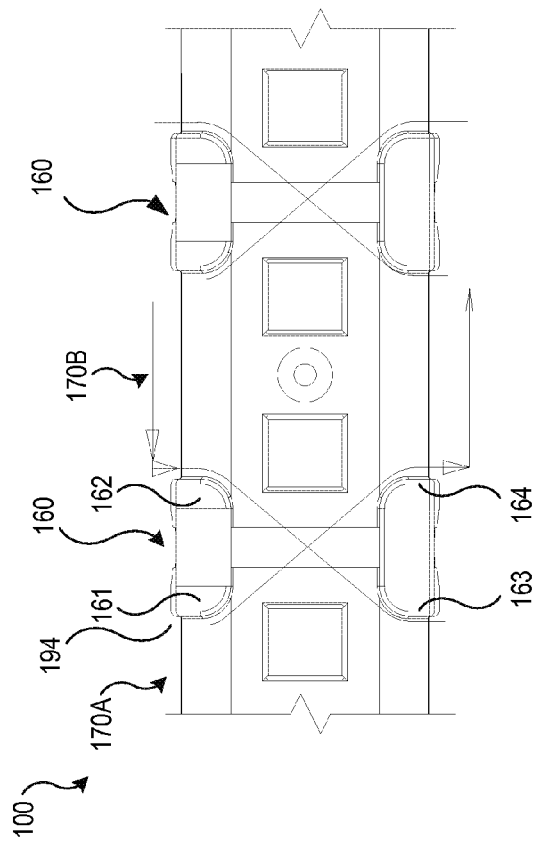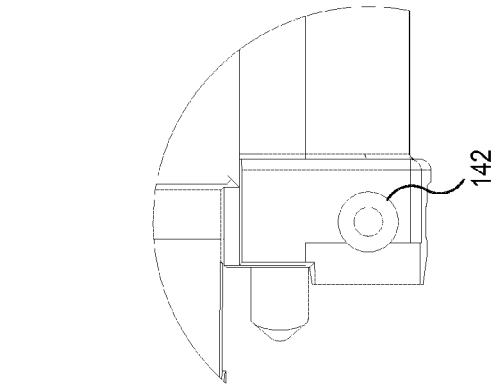

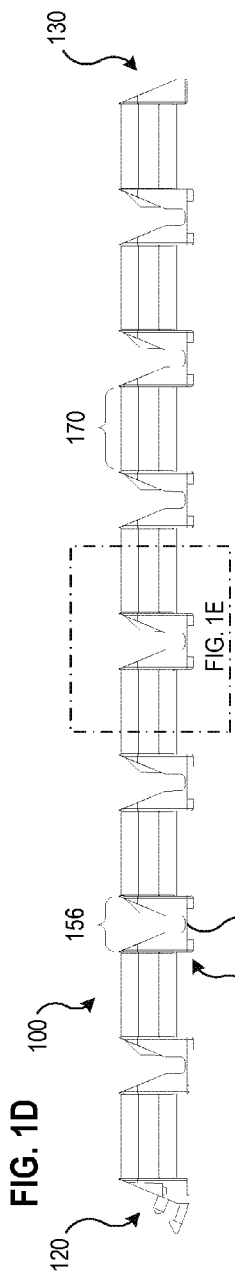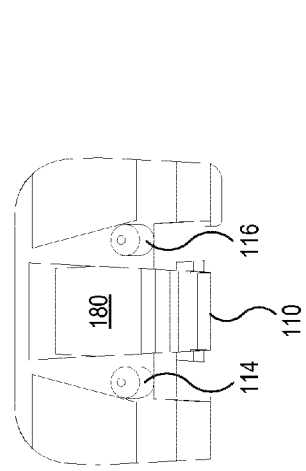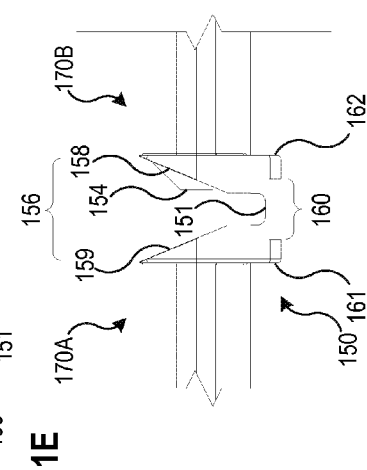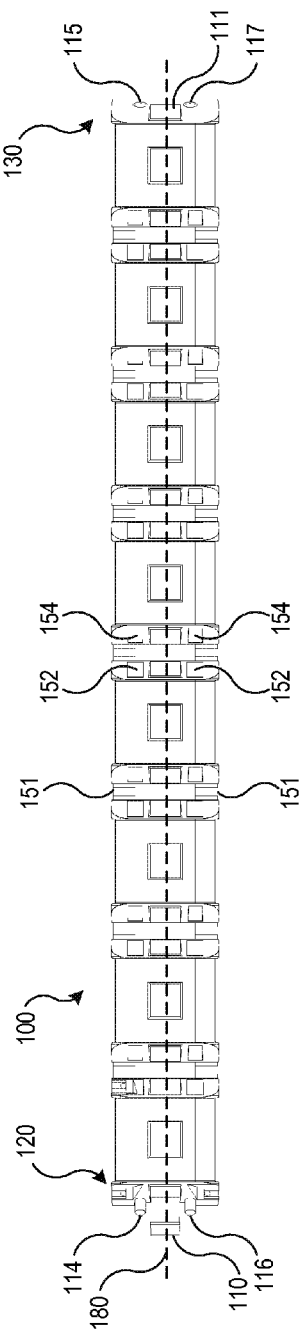

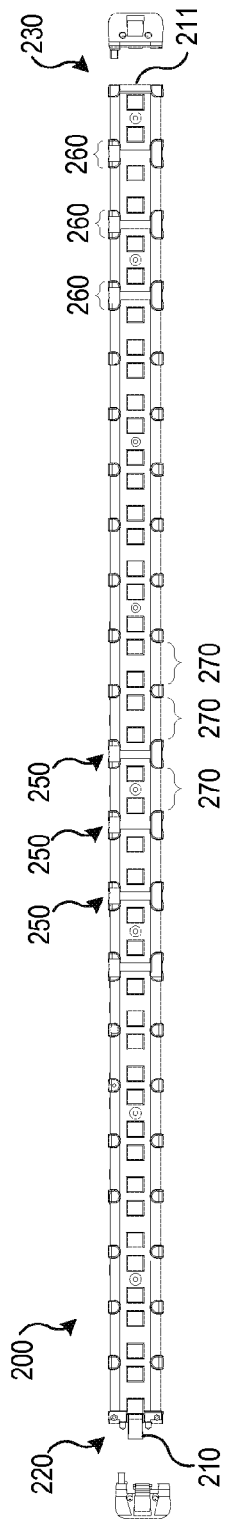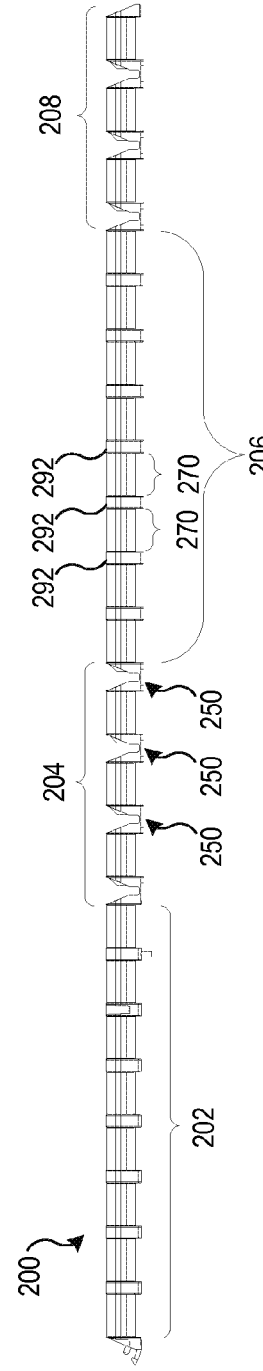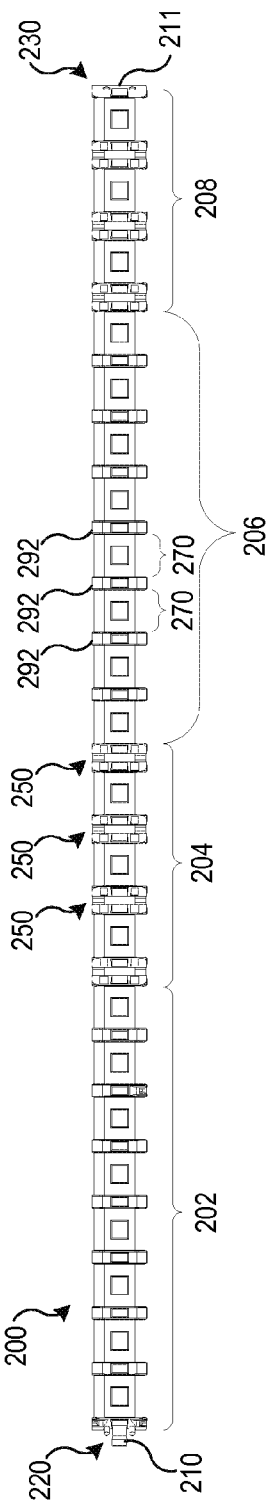

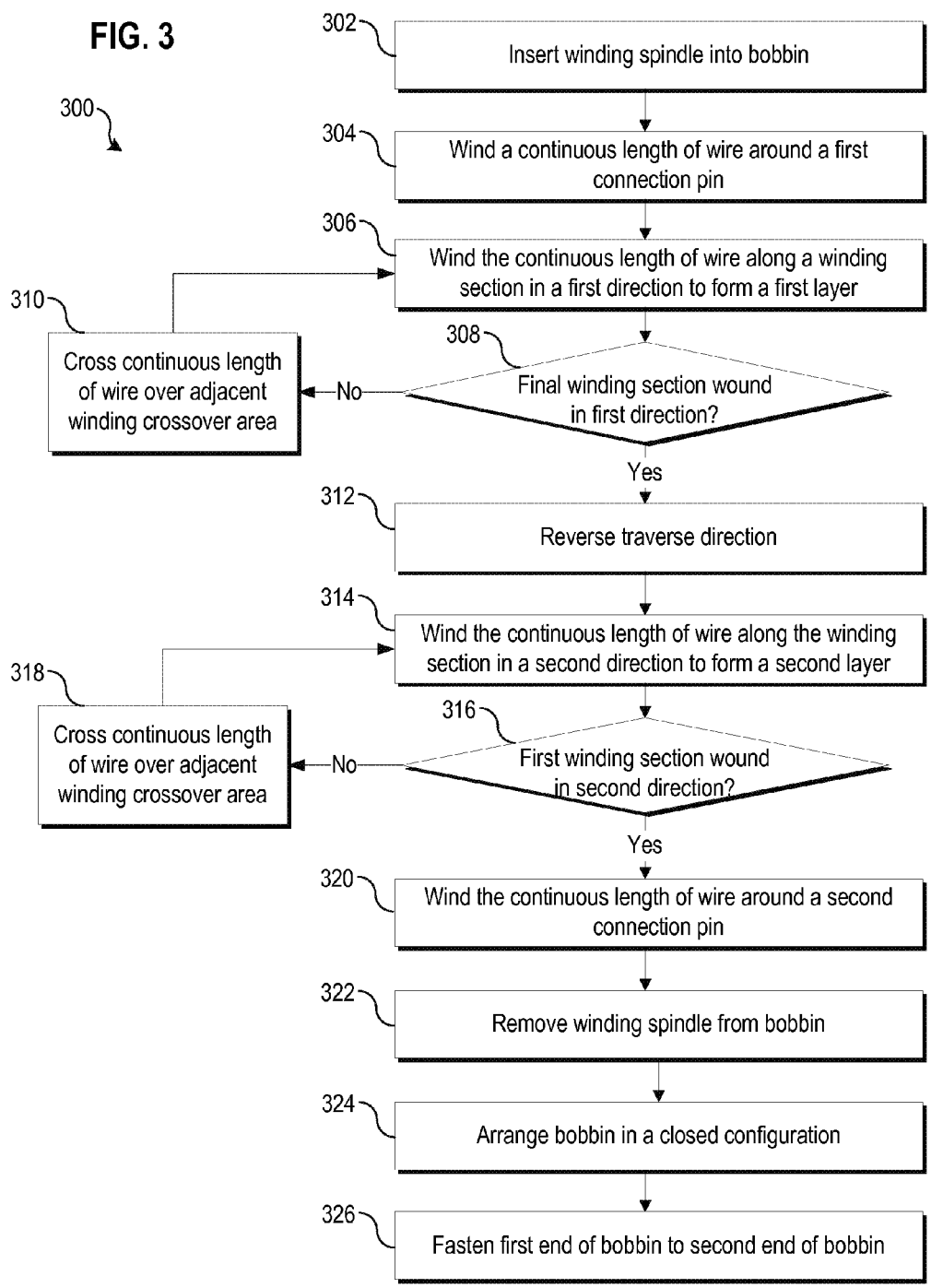

DEVICE FOR MEASURING ELECTRICAL CURRENT AND METHOD OF MANUFACTURING THE SAME

RELATED APPLICATION

This application claims the benefit under 35 U.S.C. §119(e) of U.S. Provisional Application No. 61/591,402, filed 27 Jan. 2012, naming James R. Kesler and Veselin Skendzic as inventors, which is hereby incorporated by reference herein in its entirety.

BRIEF DESCRIPTION OF THE DRAWINGS

Non-limiting and non-exhaustive embodiments of the disclosure are described, including various embodiments of the disclosure with reference to the figures, in which:

FIG. 1A illustrates a plan view of a bobbin that may be selectively configured between a linear configuration and a closed configuration and may be utilized in a device for measuring electrical current in an electrical conductor, according to one embodiment.

FIG. 1B illustrates an enlarged plan view of a portion of the bobbin shown in FIG. 1A that includes a winding pin.

FIG. 1C illustrates an enlarged plan view of a portion of the bobbin shown in FIG. 1A and illustrates the placement of a continuous length of wire with respect to a plurality of winding cross over barriers disposed near winding cross over areas.

FIG. 1D illustrates a side perspective view of the bobbin shown in FIG. 1A.

FIG. 1E illustrates an enlarged side perspective view of a portion of the bobbin shown in FIG. 1A and shows details of a hinge connecting adjacent winding sections.

FIG. 1F illustrates a bottom perspective view of the bobbin shown in FIG. 1A and shows a channel through which a removable winding spindle may be placed while the bobbin is in the linear configuration.

FIG. 1G illustrates an enlarged end perspective view of the bobbin shown in FIG. 1A and illustrates a channel into which a removable winding spindle may be inserted.

FIG. 2A illustrates a top perspective view of a bobbin that may be configured into an elongated octagonal shape and utilized in a device for measuring electrical current, according to one embodiment.

FIG. 2B illustrates a side perspective view of the bobbin shown in FIG. 2A.

FIG. 2C illustrates a bottom perspective view of the bobbin shown in FIG. 2A.

FIG. 3 illustrates a flow chart of one embodiment of a method for forming a device for measuring electrical current in an electrical conductor.

DETAILED DESCRIPTION

Figure 1H:
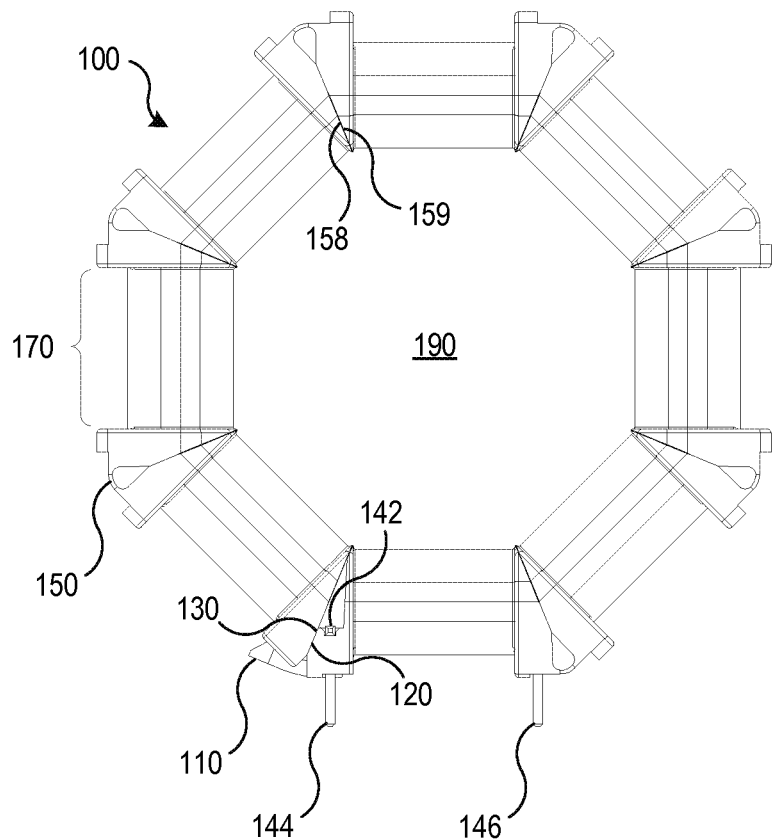
FIG. 1H illustrates a top perspective view of the bobbin shown in FIG. 1A that is formed into an octagonal shape and that may be placed around an electrical conductor to measure electrical current in the electrical conductor.

Disclosed herein are various embodiments of devices for measuring electrical current and related systems and methods for forming and using such devices. Devices according to the present disclosure may comprise Rogowski coils. Also disclosed are systems and methods for forming a current measuring device using a specifically designed bobbin that may allow for the use of a continuous length of wire for all windings in the current measuring device.

It will be appreciated that terms such as "right," "left," "top," "bottom," "above," and "side," as used herein, are merely for ease of description and refer to the orientation of the components as shown in the figures. It should be understood that any orientation of the components described herein is within the scope of the present disclosure.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor do the steps need to be executed only once, unless otherwise specified.

In some cases, well-known features, structures, or operations are not shown or described in detail. Furthermore, the described features, structures, or operations may be combined in any suitable manner in one or more embodiments. It will also be readily understood that the components of the embodiments, as generally described and illustrated in the figures herein, could be arranged and designed in a wide variety of different configurations. For example, throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

According to various embodiments, a device for measuring electrical current according to the present disclosure may be configured as a zero sequence current sensor, a single phase current sensor, or other configuration for measuring electrical current. A zero sequence current sensor according to the present disclosure may provide desirable electrical characteristics that are suitable for use in a variety of applications, including use in an electrical power delivery system. For example, the zero sequence current sensor may provide an input to an intelligent electronic device ("IED") that automates or controls an aspect or a component of an electrical power delivery system.

According to various embodiments, a single phase current sensor according to the present disclosure may also provide desirable electrical characteristics that are suitable for use in connection with a variety of applications, including use in an electrical power delivery system. A single phase current sensor, as described herein, may also be used, for example, to provide input to an IED that automates or controls an aspect or a component of an electrical power delivery system.

An IED may monitor or control a portion of an electrical power generation and delivery system. Electrical power generation and delivery systems are designed to generate, transmit, and distribute electrical energy to loads. Electrical power generation and delivery systems may include equipment, such as electrical generators, electrical motors, power transformers, power transmission and distribution lines, circuit breakers, switches, buses, transmission lines, voltage regulators, capacitor banks, and the like. Such equipment may be monitored, controlled, automated, and/or protected using IEDs that receive electric power system information from the equipment, make decisions based on the information, and provide monitoring, control, protection, and/or automation outputs to the equipment.

In some embodiments, an IED may include, for example, remote terminal units, differential relays, distance relays, directional relays, feeder relays, overcurrent relays, voltage regulator controls, voltage relays, breaker failure relays, generator relays, motor management relays, automation controllers, bay controllers, meters, recloser controls, communication processors, computing platforms, programmable logic controllers (PLCs), programmable automation controllers, input and output modules, governors, exciters, statcom controllers, SVC controllers, OLTC controllers, and the like. Further, in some embodiments, IEDs may be communicatively connected via a network that includes, for example, multiplexers, routers, hubs, gateways, firewalls, and/or switches to facilitate communications on the networks, each of which may also function as an IED. Networking and communication devices may also be integrated into an IED and/or be in communication with an IED. As used herein, an IED may include a single discrete IED or a system of multiple IEDs operating together. Devices for measuring electrical current, as described herein, may be utilized to monitor electrical characteristics associated with equipment in an electrical power generation and delivery system. According to various embodiments, devices for measuring electrical current may be configured to monitor nominal electrical current ranging between about 0.4 Amperes and 128 Amperes. Further, such devices may be configured to monitor transient electrical currents between 128 Amperes and 2,000 Amperes. Still other embodiments may be configured to monitor higher levels of nominal current and/or higher levels of transient current.

Automated manufacturing techniques may be utilized in connection with various systems and methods described herein that may facilitate the manufacture of devices for measuring electrical current and/or may reduce the cost of such devices. Various embodiments disclosed herein include the use of a bobbin that may be selectively configured between a linear configuration and a closed configuration. A closed configuration, as the term is used herein, is any configuration in which oppositely disposed ends in the linear configuration are selectively arranged in proximity.

According to various embodiments, a bobbin may be wound with a continuous length of wire from a first end to a second end. Consistent with certain other embodiments, a first continuous length of wire may be wound around a first plurality of adjacent winding sections and a second continuous length of wire may be wound around a second plurality of adjacent winding sections. The continuous length of wire may be wound along the bobbin in a first traverse direction to form a first layer, and may be wound along the bobbin in a second traverse direction to form a second layer. Forming a first layer and a second layer may increase the number of turns of wire accommodated by the bobbin, and may thus improve the sensitivity of the device for measuring electrical current. Further, the ends of the continuous length of wire may each be disposed in proximity to the first end of the bobbin. The second layer may also serve as a return winding to make the external magnetic field influence sum to zero. Certain embodiments may include a varnish or conformal coating to bind the wire to the bobbin. The use of a varnish or conformal coating may result in improved temperature tracking by linearizing the temperature coefficient associated with coil sensitivity.

Figure 1I:
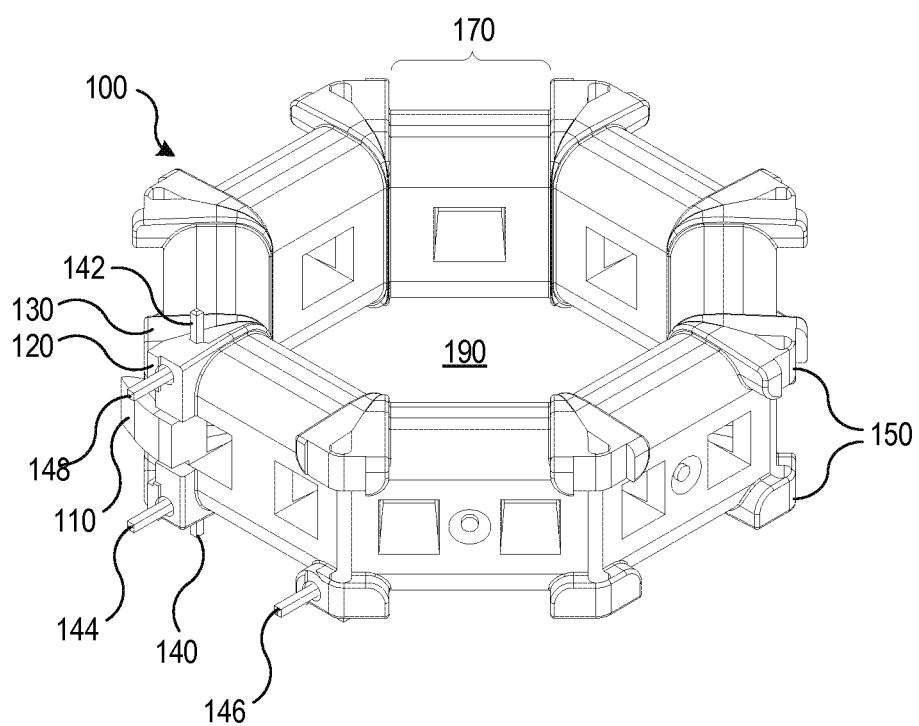
FIG. 1I illustrates an isometric perspective view of the bobbin shown in FIG. 1A that is formed into an octagonal shape.

FIG. 1A illustrates a top perspective view of a bobbin 100 that may be utilized in connection with various systems and methods disclosed herein. Bobbin 100 may be configurable in either a linear configuration, as shown in FIGS. 1A-1F, or in a closed configuration, as shown in FIGS. 1H and 1I. Bobbins according to the present disclosure may include a variety of shapes in a closed configuration. For example, a bobbin may be designed to be configured as a triangle, a square, a pentagon, a hexagon, a heptagon, an octagon, a nonagon, a decagon, etc. Bobbins may further be designed to be configured as a closed irregular shape with non-linear, non-equal sides.

Bobbin 100 includes a plurality of winding sections 170 separated by a plurality of winding cross over areas 160. A plurality of hinges 150 may be disposed along the length of bobbin 100 and between the plurality of winding sections 170. The plurality of hinges 150 may allow for bobbin 100 to be configured in either the linear configuration or in the closed configuration. A first end 120 may be selectively arranged to contact a second end 130 to configure bobbin 100 in the closed configuration. A latch 110 may be disposed on first end 120, and a keeper 111 may be disposed on second end 130 to secure first end 120 and second end 130 together in the closed configuration.

FIG. 1B illustrates an enlarged top perspective view of a portion of bobbin 100 that includes a winding pin 142. A continuous length of wire (not shown) may be initially wound around winding pin 142 to begin a winding process along the length of bobbin 100. After being wrapped around winding pin 142, the continuous length of wire may be wrapped along each of the plurality of winding sections. Further, the continuous length of wire may be transitioned between adjacent winding sections by the plurality of winding cross over areas 160.

FIG. 1C illustrates an enlarged top perspective view of a portion of bobbin 100 that includes two winding sections 170A and 170B, and two winding cross over areas 160. Each winding cross over area 160 may include winding cross over area barriers 161, 162, 163, and 164 that may help to retain the wire in a desired position while bobbin 100 is manipulated and used. As illustrated in FIG. 1C, a continuous length of wire 194 may be wound around winding section 170A until wire 194 is positioned at the top right edge of winding section 170A and adjacent to the left edge of winding cross over barrier 161. Wire 194 may cross over winding cross over area 160 and be positioned at the right edge of winding crossover area 164. From there, wire 194 may be wound around the adjacent winding section 170B. Further, continuous length of wire 194 may create a first layer of windings on a first pass along the length of bobbin 100, and may create a second layer of windings on a second pass along the length of bobbin 100. As illustrated in winding section 170B, wire 194 may be wound around winding section 170B until it reaches the right edge of winding cross over area 162. From there, wire 194 may cross over winding cross over area 160 and be positioned at the left edge of winding cross over area 163. Wire 194 may then be wound around winding section 170A to form a second layer of wire.

FIG. 1D illustrates a side perspective view of bobbin 100 and shows additional detail regarding the plurality of hinges 150 disposed along the length of bobbin 100. FIG. 1E illustrates an enlarged side perspective view of a portion of the bobbin that shows details of a hinge connecting adjacent winding sections 170A and 170B. According to the illustrated embodiment, each of the plurality of hinges 150 includes living hinges 151 (both living hinges 151 are shown in FIG. 1F) and are disposed opposite a hinge opening 156. Although a living hinge is shown in FIGS. 1D and 1E, other types of hinges may also be utilized in various embodiments. According to one embodiment, each of hinges 150 may comprise a living hinge and bobbin 100 may comprise a unitary structure. The unitary structure of bobbin 100 may be formed of plastic or other material.

In the linear configuration shown in FIGS. 1D, a hinge opening 156 is disposed opposite living hinge 151. To reconfigure bobbin 100 from the linear configuration (as shown in FIGS. 1A-1F) to a closed configuration (as shown in FIGS. 1H and 1I) the plurality of hinge openings 156 may be closed as living hinge 151 bends. The angle created between adjacent winding sections 170A and 170B in the closed configuration may be determined by angled sections 158 and 159, which are disposed on opposite sides of hinge 150.

A protruding member 154 is shown on the same side of hinge 150 as angled section 158. A complimentary receiving member (ref. no. 152 in FIG. 1F) may be configured to receive protruding member 154 in the closed configuration. Protruding member 154 and receiving member (ref. no. 152 in FIG. 1F) may help to maintain each winding section in alignment with adjacent sections.

FIG. 1E also shows winding cross over area barriers 161 and 162 in relation to hinge 150. As illustrated in FIG. 1E, winding cross over barriers 161 and 162 may be disposed on the opposite side of hinge opening 156. A wire may be positioned adjacent to the edges of winding cross over barriers 161 and 162 before crossing over winding cross over area 160 as the wire transitions between adjacent winding sections. The geometry of bobbin 100 may allow for bobbin 100 to be configured between the linear configuration (shown in FIGS. 1A-1F) and the closed configuration (shown in FIGS. 1H and 1I) without putting stress on the wire passing across winding cross over area 160.

FIGS. 1F and 1G illustrate a channel 180 into which a removable winding spindle (not shown) may be inserted in the linear configuration. FIG. 1F illustrates a bottom perspective view of bobbin 100 and illustrates channel 180 extending along the length of bobbin 100. The removable winding spindle may allow for bobbin 100 to be used with an automated system for winding a continuous length of wire along bobbin 100. After a winding operation is completed, the removable winding spindle may be removed from bobbin 100. A user may then connect latch 110 to keeper 111 to configure bobbin 100 in a closed configuration. In certain applications, it may be advantageous to increase the output of a current sensor incorporating bobbin 100. In such applications, a flexible ferromagnetic material may be inserted in place of the winding spindle. In the closed configuration, the flexible ferromagnetic material may form a closed magnetic structure.

FIGS. 1F also illustrates alignment pins 114 and 116 and joining pin apertures 115 and 117. In the closed configuration, joining pin 114 may be inserted into joining pin aperture 115, and joining pin 116 may be inserted into joining pin aperture 117. Joining pins 114 and 116 may operate in conjunction with joining pin apertures 115 and 117 to align first end 120 with second end 130.

FIGS. 1H and 1I illustrate bobbin 100 in a closed configuration. FIG. 1H shows a top perspective view of bobbin 100 formed into an octagonal shape that may be placed around an electrical conductor to measure electrical current in the electrical conductor (not shown). FIG. 1I shows an isometric perspective view of the bobbin 100 shown in FIG. 1A in an octagonal shape. To form bobbin 100 into the octagonal shape shown in FIGS. 1H and 1I, first end 120 is selectively arranged in proximity with second end 130. As first end 120 is brought selectively arranged in proximity with second end 130, the plurality of hinges 150 close, thus bringing angled sections 158 and 159 into contact with each other. Latch 110 may be secured into place with keeper (ref. no. 111 in FIG. 1F).

In the octagonal configuration illustrated in FIGS. 1H and 1I, the plurality of winding sections 170 is disposed around an opening 190. An electrical conductor (not shown) may be placed through opening 190. As electrical current flows through the conductor, potential difference (voltage) may be induced in a wire (not shown) wound around the plurality of winding sections. The voltage induced in the electrical wire varies as a function of the current flowing through the electrical conductor and is proportional to the derivative of the current.

In the closed configuration illustrated in FIGS. 1H and 1I, bobbin 100 may be self-supporting, and thus may not require additional support structure to maintain its shape. Various components of bobbin 100 may facilitate the self-supporting structure of bobbin 100. As described above, the interaction between latch 110 and latch keeper 111 may secure bobbin 100 in the closed configuration. According to certain embodiments, receiving member 152 and protruding member 154 may also contribute to the self-sustaining structure of bobbin 100. In this configuration the plurality of hinges 150 and the plurality of windings sections 170 may be configured to fully support the structure of bobbin 100. Embodiments in which bobbin 100 is self-supporting may allow for reduced complexity and improved ease of installation since no additional support components are utilized. The reduced complexity of self-supporting embodiments may further reduce the cost of such devices, since support components may be omitted from the manufacturing process. Further, installation of such devices may be facilitated since support components need not be installed after an electrical conductor is placed through opening 190.

FIGS. 1H and 1I also illustrate printed circuit board ("PCB") connection pins 144, 146, and 148, which may be utilized to mount bobbin 100 to a PCB. As disclosed in connection with FIGS. 5A-5G, for example, a current sensor formed using bobbin 100 may be incorporated into an IED. PCB connection pins 144, 146, and 148 may facilitate the mounting of a current sensor formed using bobbin 100 to a printed circuit board, which is illustrated in detail in FIGS. 5F and 5G. As shown in FIGS. 5F and 5G, a plurality of PCB connection pins 541-550 facilitate the mounting of current sensors 530, 534, 536, and 538 to a PCB 532.

FIG. 1I illustrates winding pins 140 and 142 disposed opposed on opposite sides of bobbin 100. According to one embodiment, a first end of a continuous length of wire may be wound around a first winding pin (e.g., winding pin 140) to secure the continuous length of wire to the bobbin 100. The continuous length of wire may then be wound in a first traverse direction around the plurality of winding sections 170 disposed along the length of bobbin 100 to form a first winding layer. After winding the last winding section 170 in the first traverse direction, the traverse direction may be reversed. The continuous length of wire may then be wound in a second traverse direction to form a second winding layer. After winding the last winding section 170 in the second traverse direction, a second end of the continuous length of wire may be wound around the second winding pin (e.g., winding pin 142).

FIGS. 2A, 2B, and 2C illustrate top, side, and bottom views, respectively, of a bobbin 200 that may be formed into an elongated octagon. Bobbin 200 may, according to certain embodiments, be utilized in the creation of a Rogowski coil. FIG. 2A illustrates a side perspective view of a bobbin 200 that may be configured into an elongated octagonal shape and may be utilized for a device for measuring electrical current through a conductor, according to one embodiment. Many of the features described in connection with FIGS. 1A-1I are also illustrated in FIGS. 2A, 2B, and 2C.

As shown in FIG. 2A, bobbin 200 includes a first end 220 and a second end 230. First end 220 includes a latch 210, and second end 230 includes a keeper 211. A plurality of hinges 250 is disposed along the length of bobbin 200 and a plurality of winding sections 270 is also disposed along the length of bobbin 200. Further, a plurality of winding cross over areas is also disposed along the length of bobbin 200. For clarity, only representative winding sections 270, representative hinges 250, and representative winding cross over areas 260 are labeled.

FIG. 2B illustrates a side perspective view of a bobbin 200 that includes two elongated sections 202 and 206 and two hinged sections 204 and 208. Hinged sections 204 and 208 include a plurality of hinges 250 that allow for hinged sections 204 and 208 to be folded in a manner similar to what was described in connection with FIGS. 1A-1I.

Figure 2D:
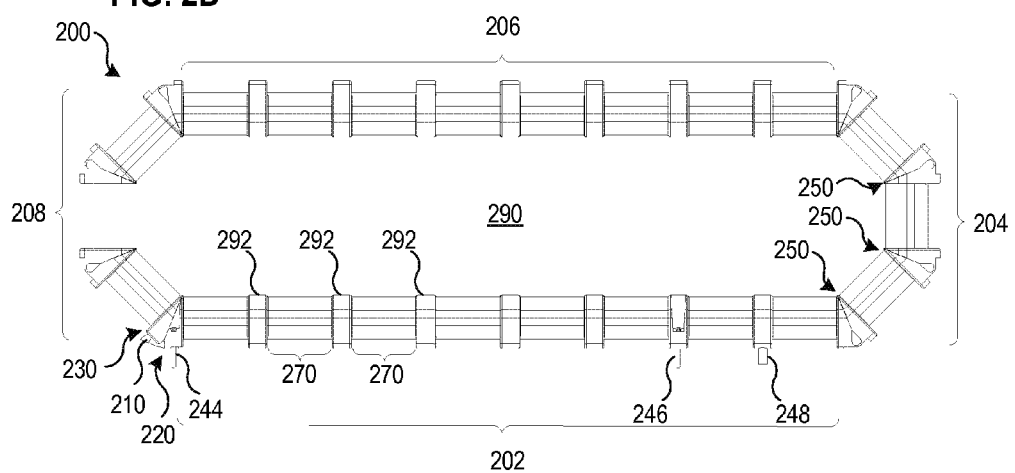
FIG. 2D illustrates a top perspective view of a bobbin formed into an elongated octagonal shape that may be placed around one or more electrical conductors to measure electrical current through the one or more electrical conductors.
Figure 2E:
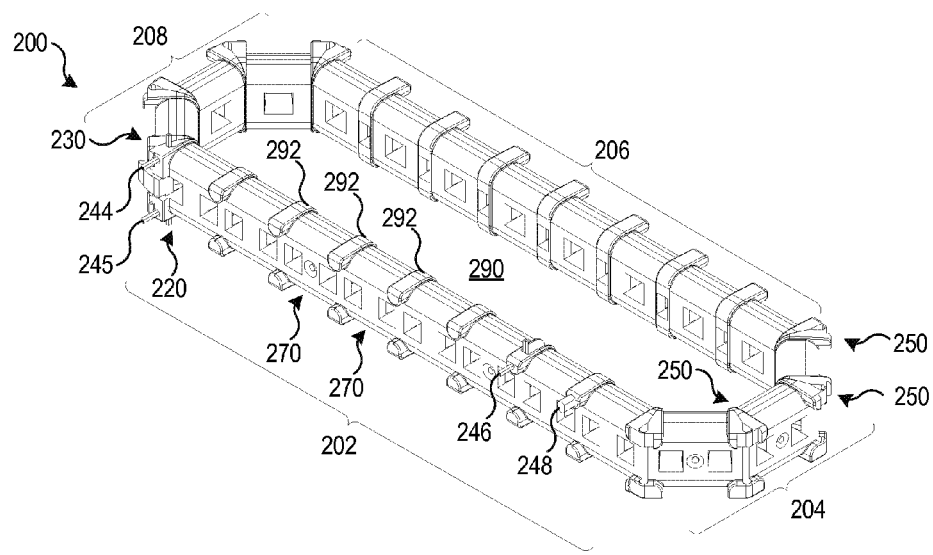
FIG. 2E illustrates an isometric perspective view of the bobbin shown in FIG. 2A.

FIGS. 2B and 2C illustrate that elongated sections 202 and 206 include a plurality of stepped sections 292 disposed between a plurality of winding sections 270. For clarity, only representative winding sections 270 and representative stepped sections 292 are labeled. Stepped sections 292 may maintain the position of adjacent winding sections 270 when bobbin 200 is reconfigured from a linear configuration (as shown in FIGS. 2A-2C) to a closed configuration (as shown in FIGS. 2D-2E). Further, stepped sections 292 may serve to balance the spacing or number of turns of wire on winding sections 270 in elongated sections 202 and 206 with the number of turns of wire on winding sections 270 in hinged sections 204 and 208. According to certain embodiments, elongated sections 202 and 206 may be free from stepped sections 292, and a continuous length of wire may be wound along the length of elongated sections 202 and 206. In such embodiments, the wire density, or the number of turns, may be adjusted to match the sensitivity of the hinged sections 204 and 208.

The wire density, or number of turns, may be independently adjusted for each winding section 270. Adjusting the wire density at one or more winding sections 270 may increase the external field rejection of a current sensor incorporating bobbin 200. Further, although each winding section in FIGS. 2A-2E is shown as having the same length, the length of winding sections 270 may be varied. For example, elongated sections 202 and 206 may comprise a single winding section with appropriately adjusted turn density.

FIGS. 2D and 2E show bobbin 200 formed into an elongated octagonal shape that may be placed around one or more electrical conductors (not shown) to measure total electrical current flowing through the conductors. As shown in FIGS. 2D and 2E, first end 220 is in contact with second end 230. In the octagonal configuration, the plurality of winding sections 270 is disposed around an opening 290. The one or more electrical conductors may be placed through opening 290. In the configuration illustrated in FIGS. 2D and 2E, bobbin 200, when properly wound, could be used as a zero sequence coil sensor. Any number of conductors may be placed through opening 290. In operation, a current sensor incorporating bobbin 200 would measure the vector sum of all currents flowing through the electrical conductors placed through opening 290.

Bobbin 200 may further include a plurality of PCB connection pins 244, 245, 246, and 248 which may facilitate mounting a current sensor incorporating bobbin 200 to a PCB. As discussed below in connection with FIG. 5, a current sensor incorporating bobbin 200 may be incorporated into an IED. Leads associated with a three-phase power supply may be routed through opening 290. A continuous length of wire (not shown) may be wound along the length of bobbin 200. Electrical signals induced in the continuous length of wire as a result of current flowing through conductors disposed in opening 290 may be coupled to an IED configured to act upon information relating to changes in the current flowing through conductors disposed in opening 290. One or more of PCB connection pins 244, 246, and 248 may also be utilized for supporting a current sensor incorporating bobbin 200 along its length and mechanically or electrically coupling a current sensor incorporating bobbin 200 to a PCB.

FIG. 3 illustrates a flow chart of one embodiment of a method 300 for forming a device for measuring electrical current in one or more electrical conductors. Method 300 may be used, for example, in connection with the embodiments illustrated in FIGS. 1A-1I and 2A-2E.

At 302, a removable winding spindle may be inserted into a bobbin. According to certain embodiments, the removable winding spindle may allow for the bobbin to be mounted on an automated winding machine. At 304, a continuous length of wire may be wound around a first connection pin to begin the winding process.

Once a winding process is initiated, an adjacent bobbin section is wound in a first direction to form a first layer using the continuous length of wire, at 306. At 308, it may be determined whether the final winding section has been wound in a first direction. In other words, it may be determined whether the final winding section has been wound in the first direction. If the final winding section has not been wound in the first direction, the continuous length of wire may be crossed over the adjacent winding cross over area, at 310. Each of elements 306, 308, and 310 may be performed for each winding section until the final winding section is reached in the first direction.

Once the final winding section is wound in the first direction, the traverse direction may be reversed, at 312. The first winding performed at elements 306, 308, and 310 may form a first layer using the continuous length of wire. To increase the number of turns of wire on the bobbin, a second layer may also be included. The second layer may also serve as a return winding to make the external magnetic field influence sum to zero. At 314, a bobbin section is wound in a second direction to form a second layer using the continuous length of wire. At 316, it may be determined whether the first winding section has been wound in the second direction. In other words, it may be determined whether the final winding section has been wound in the second direction. If the final winding section has not been wound in the second direction, the continuous length of wire may be crossed over the adjacent winding cross over area, at 318. Each of elements 314, 316, and 318 may be performed for each winding section until the final winding section is reached in the second direction.

After completing the winding of the final winding section in the second direction, the continuous length of wire may be wound around a second connection pin at 320. The wires wound around the first connection pin and second connection pin may comprise leads that can be utilized to connect the current measuring device to additional circuitry. At 322, the winding spindle may be removed from the bobbin, and the bobbin may be reconfigured from a linear configuration to a closed configuration at 324. At 326, the first end of the bobbin may be fastened to the second end of the bobbin.

Figure 4:
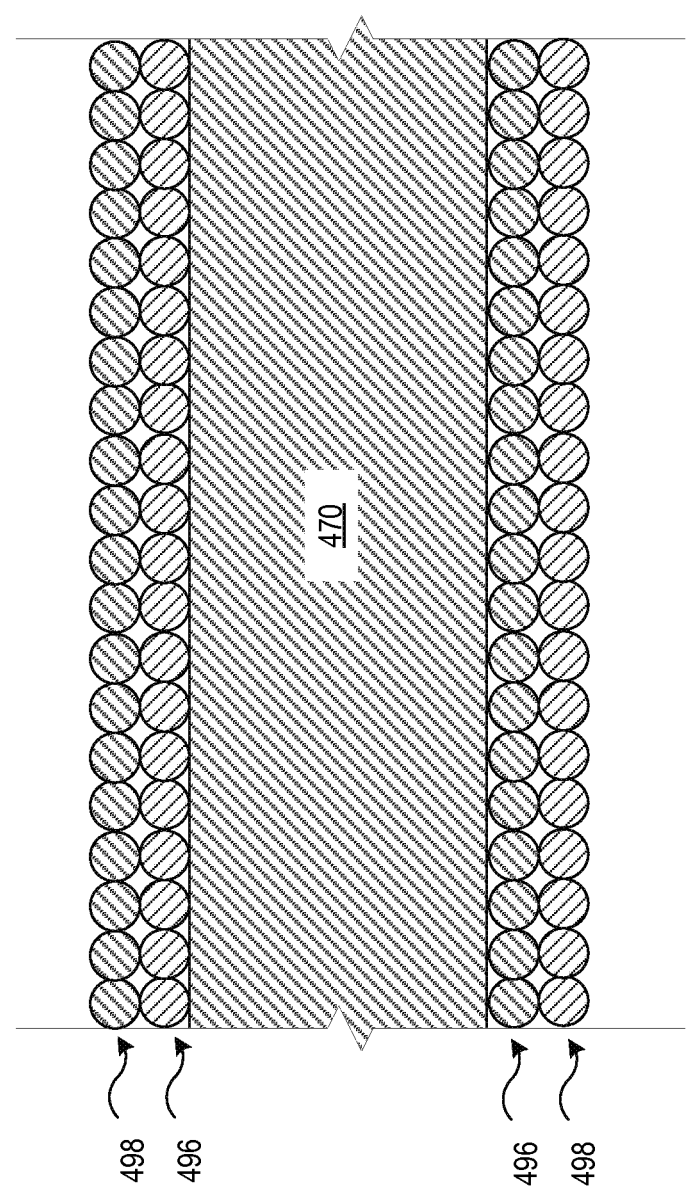
FIG. 4 illustrates a cross sectional view of one winding section of a device for measuring electrical current and illustrates a first winding layer and a second winding layer.

FIG. 4 illustrates a cross sectional view of one winding section 470 of a device for measuring electrical current and illustrates a first winding layer 496 and a second winding layer 498 disposed around a winding section 470. According to various embodiments, first winding layer 496 may be wound around winding section 470 in a first pass and second winding layer 496 may be bound around winding section 470 in a second pass. Further, according to various embodiments, a continuous length of wire may be utilized to form first winding layer 496 and second winding layer 498.

Figure 5A:
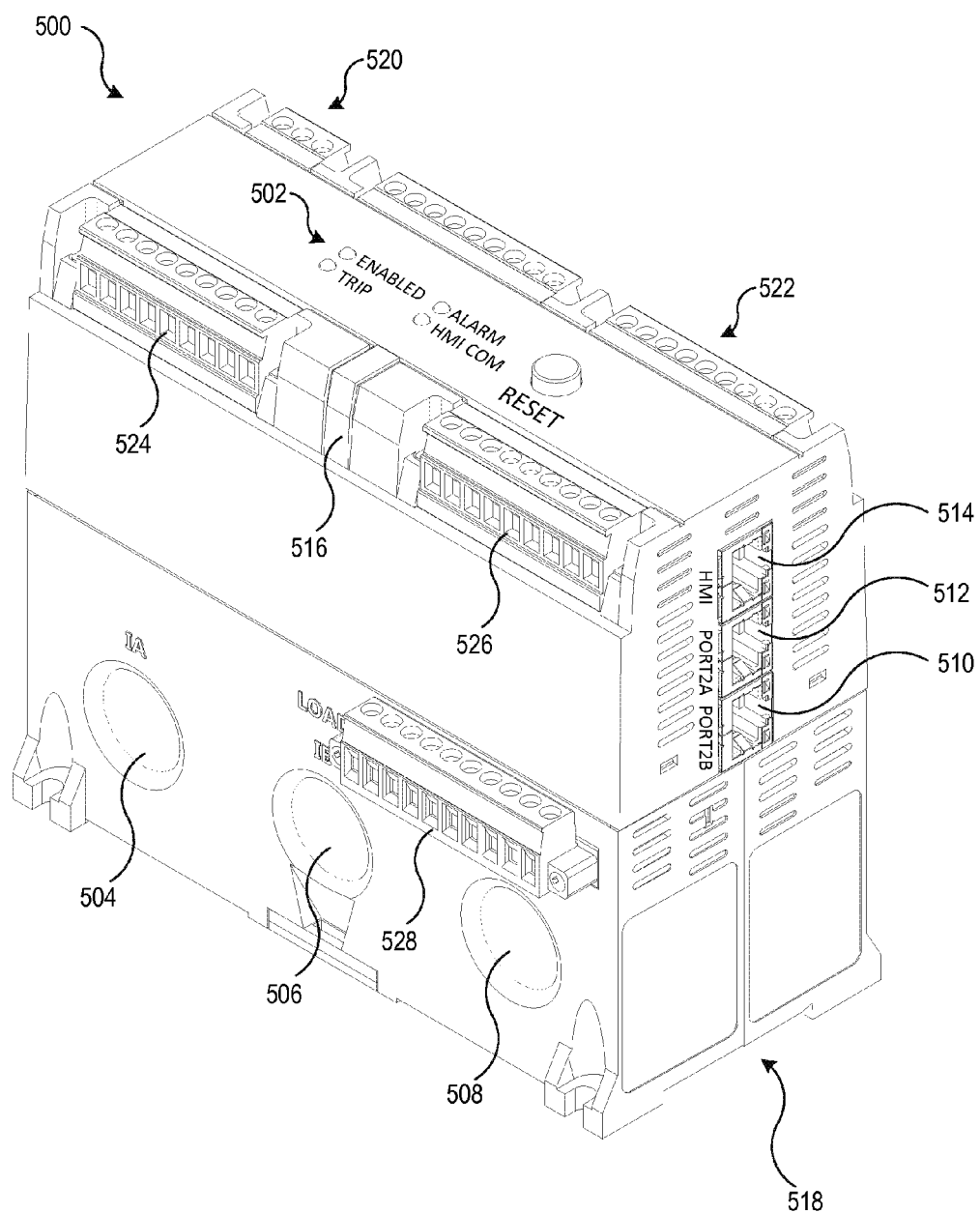
FIG. 5A illustrates an isometric view of a motor management relay that incorporates current sensors, according to one embodiment.

FIG. 5A illustrates an isometric view of a motor management relay 500 that incorporates a plurality of current sensors according to the present disclosure. Motor management relay 500 may provide a variety of functions, including thermal protection, arc flash detection, performance monitoring, a human-machine interface, process protection, and a communications system for relaying information regarding electrical current provided to the motor. A motor management relay may be used in a variety of applications, including pumping applications for water, chemicals, and petroleum; air-based applications, including fans, blowers, air handlers, and compressors; chiller applications, such as compressors and air-conditioning; applications involving bulk materials, such as conveyors, crushers, screeners, feeders, augers, and bucket elevators.

Figure 5B:
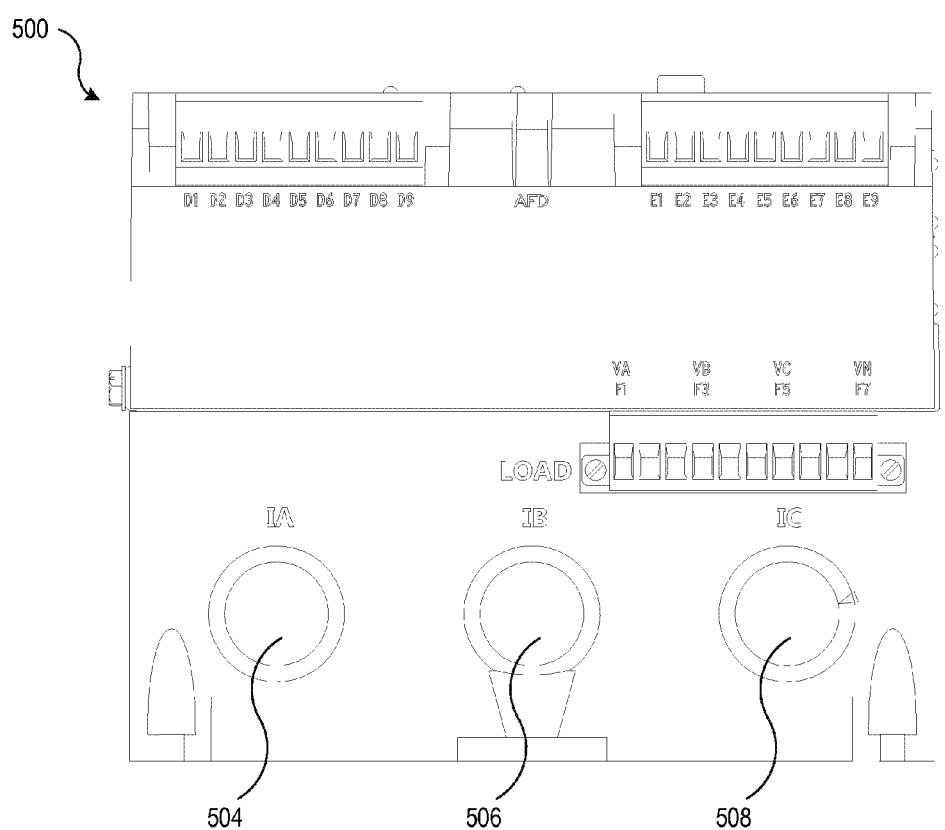
FIG. 5B illustrates a front view of the motor management relay of FIG. 5A.

Various embodiments of a motor management relay 500 according to the present disclosure may be configured to have a small form factor. Various features may be incorporated into the relay to reduce the size of motor management relay 500. According to the illustrated embodiment, motor management relay 500 incorporates a plurality of current sensors (illustrated in FIGS. 5C-5G), which in addition to reducing size, may also reduce installation time. Current sensors (ref. nos. 530, 534, 536, and 538 in FIGS. 5C-5G) may be disposed around apertures 504, 506 and 508. Apertures 504, 506, and 508 may be associated with three-phase power feeds connected to a motor. Each aperture 504, 506, and 508 may be surrounded by a Rogowski coil, such as the embodiment illustrated in FIGS. 1H and 1I. In addition, motor management relay 500 may also incorporate a zero-sequence current transformer, which may be formed using the bobbin illustrated in FIGS. 2D and 2E. As illustrated in FIG. 5B, apertures 504, 506, and 508 extend through motor management relay 500. Three conductors (not shown) may be routed through apertures 504, 506, and 508 and may provide three-phase power to an electrical motor (not shown).

Returning to FIG. 5A, motor management relay 500 may also include a plurality of communications ports 510, 512, and 514. Communications ports 510, 512, and 514 may allow for motor management relay 500 to communicate with a variety of control systems (not shown) and/or human-machine interface ("HMI") devices (not shown). In addition, motor management relay 500 may be configured to communicate using a variety of communications protocols, such as Modbus® RTU, Modbus TCP, and IEC 61850, etc.

According to the illustrated embodiment, communications port 514 is illustrated as an HMI port; however, according to alternative embodiments, any communications port may be utilized for an HMI port. In addition, certain information may be displayed by way of indicators 502 disposed on top of motor management relay 500. According to the illustrated embodiment, indicators may be provided to display whether the device is enabled, whether an alarm condition has been detected, whether a trip condition has been detected, and the status of communication with an HMI.

Motor management relay 500 may incorporate a variety of contact input/output ports ("I/O Ports") 524, 526, and 528 that facilitate communication with various devices and systems. According to the illustrated embodiment I/O Connectors 524 and 526 may be embodied as EIA-232 or EIA-485 serial ports, and I/O Connector 528 may be embodied as a direct-connect voltage input. Port 522 may be embodied as an EIA-232 or EIA-485 serial port. Port 520 may serve as a connection point for a power supply.

According to the illustrated embodiment, relay 500 incorporates an optical arc flash detector 516. A motor control cabinet may have a large fault-current potential, which may result in increased arc-flash hazards. Optical detection of arc flash conditions may be utilized to improve protection and reduce arc flash energy. Upon the detection of an arc-flash event, the circuit providing power to the motor may be interrupted to prevent damage to the motor and other equipment.

Motor management relay 500, according to various embodiments may be utilized in connection with a small motor control center drawer or bucket. Motor management relay 500 may be configured to operate in conjunction with various mounting systems. According to the illustrated embodiment, motor management relay 500 incorporates a DIN rail-mounting system 518.

Motor management relay 500 may provide information relating to the operation of a monitored motor. Such information may include information relevant to the operation and reliability of the motor, such as operating statistics, motor starts, motor overload, temperature reports, two-speed motor operation, and motor restart after power restoration. In addition, information regarding the electrical characteristics may also be collected, such as voltage and current provided to the power, the power factor associated with the motor, the load profile, etc.

Motor management relay 500 may also allow for integration with a control system (not shown) responsible for monitoring and controlling a power distribution system. The control system may allow for integration with a variety of control and monitoring systems that may allow for protection and monitoring systems to be implemented using motor management relay 500.

Figure 5C:
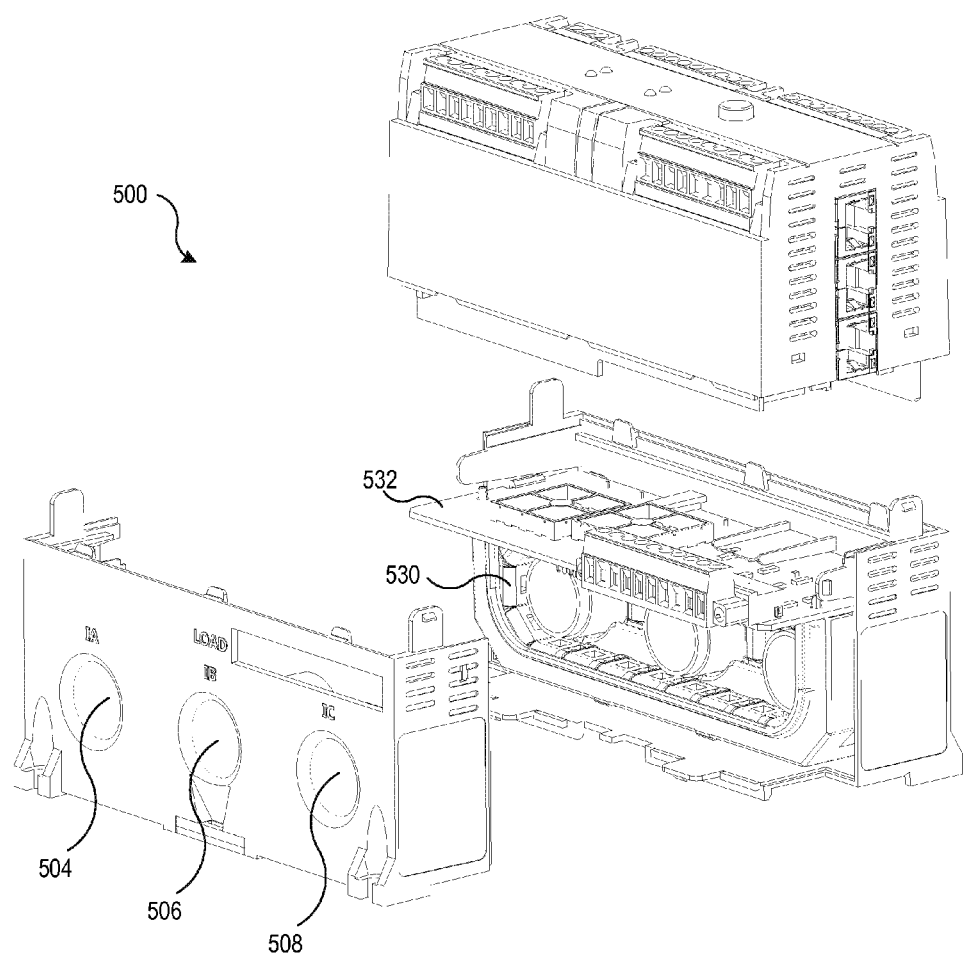
FIG. 5C illustrates a partially exploded view of the motor management relay of FIG. 5A, and illustrates a printed circuit board to which a plurality of current sensors may be mounted.

FIG. 5C illustrates an exploded view of motor management relay 500. Motor management relay 500 includes a PCB 532, to which a plurality of current sensors may be mounted. Although only a single current sensor 530 is shown in FIG. 5C, additional current sensors 534, 536, and 538 are illustrated in FIG. 5D.

Figure 5D:
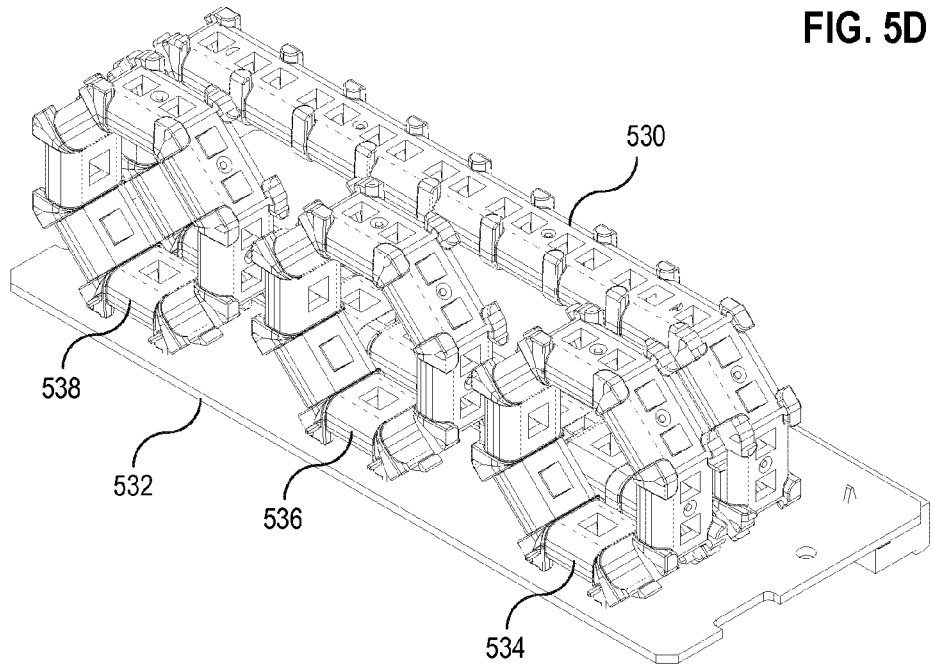
FIG. 5D illustrates an isometric view of the printed circuit board and the plurality of current sensors shown in FIG. 5C.

As illustrated in FIG. 5D, four current sensors may be incorporated into motor management relay 500 as illustrated in FIGS. 5A-5C. Current sensor 530 may be configured as a zero-sequence current sensor, while current sensors 534, 536, and 538 may each be associated with a respective conductor (not shown) passing through apertures 508, 506, and 504 (shown in FIG. 5C), respectively, and providing electrical power to a motor (not shown). Electrical characteristics associated with each conductor may be monitored using current sensors 534, 536, and 538. Electrical characteristics associated with each of the conductors may be gathered using current sensor 530, and such electrical characteristics may be used to generate zero sequence information associated with the system.

Figure 5E:
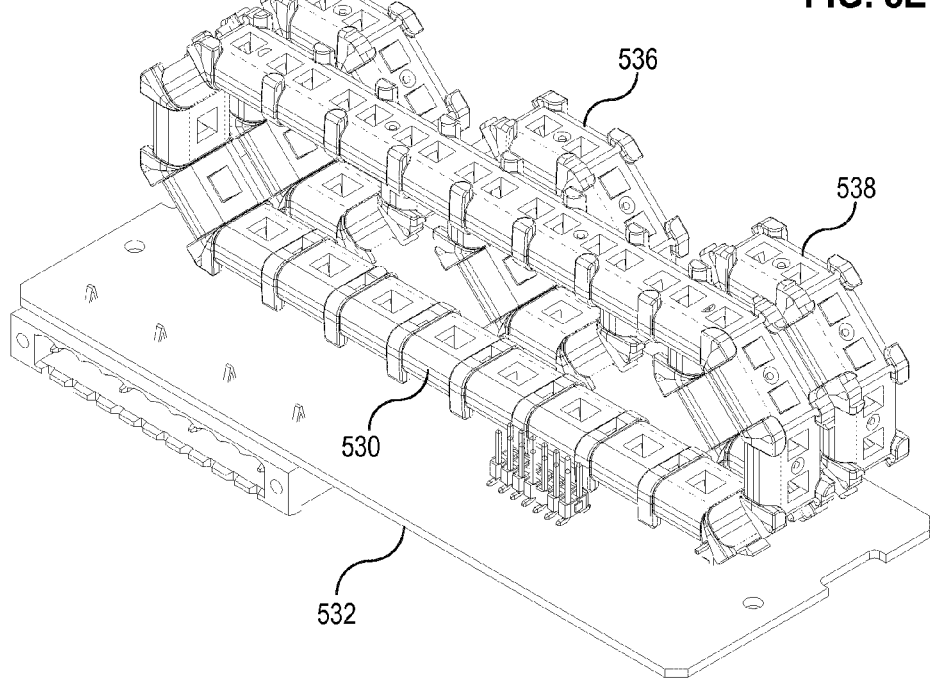
FIG. 5E illustrates a rotated view of the printed circuit board and the plurality of current sensors shown in FIG. 5D.
Figure 5F:
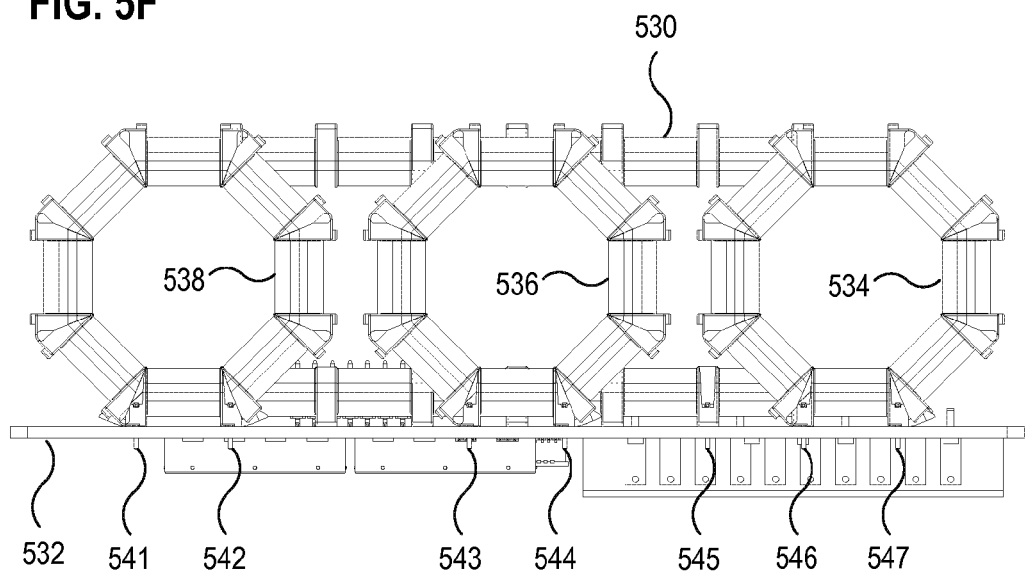
FIG. 5F illustrates a plan view of the printed circuit board and the plurality of current sensors shown in FIG. 5D, and further illustrates a plurality of PCB connection pins configured to facilitate the mounting of the plurality of current sensors to the printed circuit board.
Figure 5G:
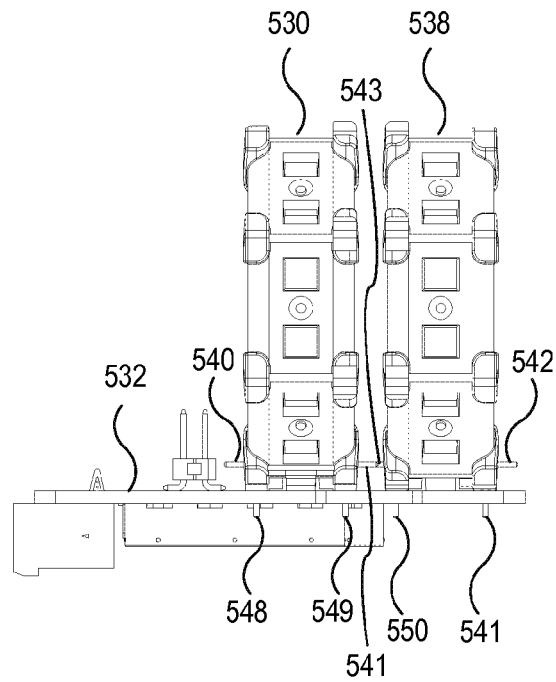
FIG. 5G illustrates a side plan view of the printed circuit board and the plurality of current sensors shown in FIG. 5F.

As illustrated in FIGS. 5D and 5E, current sensors 530, 534, 536, and 538 may each be mounted to PCB 532. As discussed above, the bobbins used in forming current sensors 530, 534, 536, and 538 may include PCB connection pins that may allow for the current sensors to be directly mounted to PCB 532.

FIGS. 5F and 5G illustrate a plurality of PCB connection pins 541-550 configured to facilitate the mounting of current sensors 530, 534, 536, and 538 to PCB 532. According to the illustrated embodiment, PCB connection pins 541-550 extend through PCB 532. An electrical connection to PCB connection pins 541-550 may be made on either surface of PCB 532. In addition to facilitating electrical contact with other components located on PCB 532, the portion of PCB connection pins 541-550 extending through PCB 532 may also be used to secure current sensors 530, 534, 536, and 538 to PCB 532. According to certain embodiments, mechanical fasteners may be utilized to secure current sensors 530, 534, 536, and 538 to PCB 532. According to other embodiments, solder or some other electrically conductive material may create both an electrical contact and be utilized to secure current sensors 530, 534, 536, and 538 to PCB 532. According to the illustrated embodiment, PCB connection pins 541-550 extend through PCB 532; however, according to alternative embodiments, PCB connection pins may facilitate mounting of a current sensor to a PCB without extending through the PCB. FIG. 5G also illustrates a plurality of winding pins 540-543, which may be utilized in some embodiments as points of contact between current sensors 530, 534, 536, and 538 and PCB 532.

Although FIGS. 5A-5G illustrate the use of current sensors according to the present disclosure in connection with a motor management relay, devices for measuring electrical current according to the present disclosure may be incorporated into a wide range of IEDs. For example, a current sensor as disclosed herein may be utilized as an integrated component or as an input for differential relays, distance relays, directional relays, feeder relays, overcurrent relays, generator relays, etc.

While specific embodiments and applications of the disclosure have been illustrated and described, the disclosure is not limited to the precise configuration and components disclosed herein. Various modifications, changes, and variations may be made in the arrangement, operation, and details of the methods and systems of the disclosure without departing from the spirit and scope of the disclosure.

What is claimed is:

1. A current sensor, comprising:
 a continuous length of wire; and
 a one-piece folding bobbin, comprising:
  a first end;
  a second end;
  a plurality of winding sections formed in the one-piece folding bobbin, configured to be wound with the continuous length of wire;
  a plurality of living hinges formed in the one-piece folding bobbin and flexibly linking each winding section to its adjacent winding section of the plurality of winding sections and configured to allow the one-piece folding bobbin to transition between a linear configuration and a closed configuration;
 wherein the first end and the second end of the one-piece folding bobbin are selectively arranged in proximity to reconfigure the one-piece folding bobbin from the linear configuration to the closed configuration.

2. The current sensor of claim 1, wherein the bobbin further comprises a channel configured to receive a removable winding spindle, the channel configured to allow the winding spindle to pass through the first end, the second end, the plurality of winding sections, and the plurality of hinges in the linear configuration.

3. The current sensor of claim 1, wherein the bobbin further comprises:
 a plurality of stepped sections disposed between at least two winding sections and configured to maintain the at least two winding sections in the same relative alignment in the linear configuration and the closed configuration.

4. The current sensor of claim 1, wherein the current sensor comprises a zero-sequence coil.

5. The current sensor of claim 1, wherein the bobbin further comprises a latch disposed on the first end and a keeper disposed on the second end, the latch and keeper configured to secure the first and the second end in the closed configuration.

6. The current sensor of claim 1, wherein the bobbin comprises a self-supporting structure in the closed configuration.

7. The current sensor of claim 1, wherein the current sensor comprises one of a hexagon, an octagon, and a decagon in the closed configuration.

8. The current sensor of claim 1, wherein the current sensor comprises one of an elongated hexagon, an elongated octagon, and an elongated decagon in the closed configuration.

9. The current sensor of claim 8, wherein each of the plurality of hinges comprises a living hinge, and wherein the bobbin comprises a unitary structure.

10. The current sensor of claim 8, wherein the distance between a first winding section disposed on a first side of the living hinge and a second winding section disposed on a second side of the living hinge is reduced in the closed configuration.

11. The current sensor of claim 10, wherein the second layer is disposed on top of the first layer.

12. The current sensor of claim 10, further comprising a first winding pin and a second winding pin, the first winding pin configured to receive a first end of the continuous length of wire and to secure the first end of the continuous length of wire to the bobbin prior to being wound in the first traverse direction, the second winding pin configured to receive a second end of the continuous length of wire and to secure the second end of the continuous length of wire to the bobbin after being wound in the second traverse direction.

13. The current sensor of claim 11, wherein the first winding pin and the second winding pin are each disposed in proximity to the first end of the bobbin.

14. The current sensor of claim 1, wherein the plurality of hinges comprises at least one living hinge.

15. The current sensor of claim 1, wherein the continuous length of wire is wound in a first traverse direction along a length of the bobbin to form a first layer, and the continuous length of wire is wound in a second traverse direction along the length of the bobbin to form a second layer.

16. The current sensor of claim 1, further comprising a plurality of printed circuit board connection pins configured to mount the current sensor directly to a printed circuit board.

17. The current sensor of claim 1, further comprising a flexible ferromagnetic material configured to be inserted into the channel such that the flexible ferromagnetic material forms a closed magnetic structure in the closed configuration.

18. The current sensor of claim 1, wherein the current sensor comprises a Rogowski coil.

19. The current sensor of claim 1, wherein the current sensor is configured to monitor nominal electrical currents between about 0.4 Amperes and 128 Amperes.

20. The current sensor of claim 1, wherein the current sensor is configured to measure transient electrical currents between about 128 Amperes and 2,000 Amperes.

21. The current sensor of claim 1, further comprising a conformal coating disposed along at least a portion of the bobbin and configured to bind the continuous length of wire to the bobbin.

22. The current sensor of claim 21, wherein the intelligent electronic device comprises a motor management relay.

23. The current sensor of claim 1, wherein the current sensor is configured to be disposed within an intelligent electronic device.

24. The current sensor of claim 23, wherein the motor management relay analyzes input from the current sensor to provide protection to a motor.

25. The current sensor of claim 1, wherein:
each winding section of the plurality of winding sections includes a hinge opening opposite to the living hinges; and
the closed configuration of the one-piece folding bobbin comprises the hinge openings each in a closed position.

26. The current sensor of claim 25, further comprising protruding members and receiving members formed in the hinge openings wherein in the closed configuration the protruding member is received in the receiving member.

27. A one-piece folding bobbin for use in connection with a current sensor, the one-piece folding bobbin comprising:
a first end;
a second end;
a first plurality of winding sections formed in the one-piece folding bobbin configured to be wound with a first continuous length of wire;
a second plurality of winding sections formed in the one-piece folding bobbin configured to be wound with a second continuous length of wire;
a plurality of living hinges formed in the one-piece folding bobbin and flexibly linking the first and second plurality of winding sections and configured to allow the one-piece folding bobbin to transition between a linear configuration and a closed configuration;
wherein the first end and the second end are selectively arranged in proximity to reconfigure the one-piece folding bobbin from the linear configuration to the closed configuration.

28. The one-piece folding bobbin of claim 27, wherein the bobbin is configured as a zero-sequence coil comprising:
a first elongated section;
a second elongated section;
wherein the first elongated section is wound with the first continuous length of wire and the second elongated section is wound with the second continuous length of wire.

29. The one-piece folding bobbin of claim 27, wherein the first continuous length of wire is continuous with the second continuous length of wire.

30. The one-piece folding bobbin of claim 27, further comprising a plurality of hinge openings opposite the plurality of living hinges, wherein the closed configuration of the one-piece folding bobbin comprises the hinge openings each in a closed position.

31. The one-piece folding bobbin of claim 30, further comprising protruding members and receiving members formed in the hinge openings, wherein in the closed configuration the protruding member is received in the receiving member.

32. A current sensor, comprising:
a continuous length of wire; and
a one-piece bobbin, comprising:
a first end;
a second end;
a plurality of winding sections formed in the one-piece bobbin, configured to be wound with the continuous length of wire;
a plurality of living hinges formed in the one-piece bobbin and flexibly linking each winding section to its adjacent winding section of the plurality of winding sections and configured to allow the one-piece bobbin to transition between a linear configuration and a closed configuration with the living hinges on an outside circumference of the one-piece bobbin in closed configuration;
wherein the first end and the second end of the one-piece bobbin are selectively arranged in proximity to reconfigure the one-piece bobbin from the linear configuration to the closed configuration.

* * * * *